United States Patent
Jain et al.

(10) Patent No.: US 7,689,377 B2
(45) Date of Patent: Mar. 30, 2010

(54) TECHNIQUE FOR AGING INDUCED PERFORMANCE DRIFT COMPENSATION IN AN INTEGRATED CIRCUIT

(75) Inventors: Palkesh Jain, Bangalore (IN); Hugh Thomas Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 355 days.

(21) Appl. No.: 11/562,431

(22) Filed: Nov. 22, 2006

(65) Prior Publication Data

US 2008/0116455 A1    May 22, 2008

(51) Int. Cl.
- *G06F 19/00* (2006.01)
- *H01L 23/58* (2006.01)
- *G01R 31/26* (2006.01)
- *H01L 21/00* (2006.01)

(52) U.S. Cl. .................. 702/117; 257/48; 324/769; 438/4

(58) Field of Classification Search ............... 702/117; 324/763, 769; 257/48, 314, 411; 438/14, 438/786, 4

See application file for complete search history.

(56) References Cited

U.S. PATENT DOCUMENTS

| | | | | |
|---|---|---|---|---|
| 4,750,023 | A * | 6/1988 | Shannon | 257/336 |
| 6,690,689 | B2 * | 2/2004 | Ackerman et al. | 372/20 |
| 2006/0223201 | A1 * | 10/2006 | Liu et al. | 438/10 |

* cited by examiner

*Primary Examiner*—Bryan Bui
(74) *Attorney, Agent, or Firm*—Dawn V. Stephens; Wade James Brady, III; Frederick J. Telecky, Jr.

(57) ABSTRACT

An improved compensation circuit that compensates for lifetime performance drifts due to aging of integrated circuits to improve the circuit performance. In one example embodiment, this is achieved by applying a body bias voltage VBB to the integrated circuit to compensate for the lifetime performance drift due to hot carrier and NBTI induced aging.

24 Claims, 3 Drawing Sheets

TECHNIQUE FOR AGING INDUCED PERFORMANCE DRIFT COMPENSATION IN AN INTEGRATED CIRCUIT

TECHNICAL FIELD OF THE INVENTION

The present invention relates generally to integrated circuits, and more particularly relates to ways in which to improve circuit performance by compensating for the metal-oxide-semiconductor (MOS) transistor degradation due to aging.

BACKGROUND OF THE INVENTION

Integrated circuits based on complementary metal-oxide semiconductor (CMOS) transistor technology are widely used in modern electronic systems. The proper performance of CMOS integrated circuits is often critically dependent on the stable operation of its MOS transistors. Even relatively small changes in transistor performance can have a strong impact on the operation of sensitive circuitry on a high performance CMOS chip.

The operation of a transistor can be significantly affected by changes in the transistor's threshold voltage due to aging induced by hot carrier, which is also referred to as CHC (channel hot carrier), and Negative Bias Temperature Instability (NBTI). High performance PMOS transistors exhibit instability after voltage/temperature aging. This phenomenon is known as NBTI. The instability occurs under negative gate voltage and is measured as an increase in the magnitude of threshold voltage. Higher stress temperatures produce more degradation. Hot carrier, on the other hand, is a degradation phenomenon, more prominent in nMOS transistors, wherein the performance of the nMOS transistor degrades due to injection of hot carriers into the gate oxide. This manifests itself in degrading the transistor threshold voltages and mobility, which can eventually lead to reduction of the drive current, ION.

If a transistor's threshold voltage increases even slightly, the transistor's ability to drive current may be reduced sufficiently that a sensitive digital logic circuit in which the transistor is operating will slow down substantially or no longer function properly and the gain of certain sensitive analog circuits may be degraded. This can disrupt the proper functioning of the entire integrated circuit.

CMOS integrated circuits contain p-channel (PMOS) and n-channel (NMOS) transistors. The threshold voltage of a PMOS transistor can change over time due to NBTI instability induced aging. NBTI arises when MOS devices are exposed to negative gate bias voltages under elevated operating temperatures, i.e., the input of CMOS inverter is held at logic 'low'. Threshold voltage increases due to NBTI may be significant, i.e., on the order of tens of millivolts over the lifetime of a circuit. The threshold voltages in NMOS transistors may also increase over time due to the accumulation of gate-oxide change from hot carrier effects, known as CHC; this happens when the transistors are conducting current—typically when the transistors are switching their states in a digital integrated circuit or the pass gates like scenarios in analog circuits. Generally, NBTI induced aging affects PMOS pull-up performance and CHC related aging degrades NMOS pull-down performance.

Traditional way to deal with transistor performance degradation phenomenon at the design level is through margining. This involves making bounding predictions on the performance of the integrated circuit by estimating the extent to which a representative transistor can degrade under certain operating conditions.

The current techniques assess the reliability kinetics of a circuit to estimate the product performance drift after a stipulated lifetime at a defined set of stress voltage and temperature. The term "product performance drift" refers to deterioration in a circuit operating frequency due to transistor slow-down induced by aging. The product performance drift can also manifest in increasing the delay of the critical path in a chip and hence can result in leading to functional failures. The reliability kinetics is obtain by either performing reliability simulations in a BERT (Berkeley Reliability Tools) like framework, wherein the product lifetime, operating voltage and temperature are fed in the simulator to get the performance drift as an output, or by performing silicon level measurements that uses targeted design of experiments at accelerated stress conditions to output an empirically or physically based mean reliability model as a function of time and stress parameters.

The above technique is a default choice for many designers due to lack of techniques which can reduce aging, except for a few techniques that are employed at transistor level for alleviating hot carrier degradation to a certain extent. This includes increasing the channel length of the nMOS device or stacking it with another device; both of these, however, can come with penalties—either in area or in performance.

One current technique solves the problem at design level by increasing VDD (headroom) by tracking aging of the reference circuit to recover the lost performance. However, this technique does not provide an individual handle on a PMOS device. Further, this technique applies the same increased operating voltage VDD to both PMOS and NMOS transistors in the integrated circuit even though they degrade at different rates due to aging, which can significantly affect the integrated circuit properties by skewing the beta ratio. Furthermore, increasing operating voltage VDD can result in further performance degradation as it is one primary reason for degradation of circuits. Hence, an increment in VDD over the lifetime also risks an accelerated aging of the integrated circuit. In addition, it also poses an increase in leakage power over the circuit lifetime.

Another technique requires using redundant circuitry to counter the effects of aging on the threshold voltage. Such compensation schemes are costly in terms of the area and also generally do not guarantee constant/drift-less performance over the circuit lifetime.

Thus, the existing schemes to determine the impact of hot carrier and NBTI induced aging on the performance of CMOS circuits and to recover the degraded performance are costly and inefficient.

SUMMARY OF THE INVENTION

According to an aspect of the present subject matter, there is provided a method for compensating hot carrier and NBTI induced effects on metal-oxide-semiconductor (MOS) transistor, comprising the step of compensating for product performance drift due to aging of an integrated circuit over life time by applying a body bias voltage VBB to the integrated circuit.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The term "reliability simulations" refers to performing simulations of the integrated circuit by using Berkeley Reliability Tools (BERT) like techniques that are relevant for hot carrier and NBTI induced aging. Also, the term "performing silicon level measurements at accelerated stress conditions" means applying a reasonably high stress voltage at elevated temperatures for a short period of time on a representative circuit to determine the time evolution of performance drift as a function of the applied stress voltage and operating temperature. This formulation can be used to estimate the performance drift under use conditions. In addition, the term "product performance drift" refers to an increase in threshold voltage, reduction in a transistor mobility, increase in its resistance, increase in its leakage current and the like due to aging, which can manifest itself in a reduction of drive current and which can further result in a reduction in the performance of the integrated circuit.

The terms "product performance drift" and "lifetime performance drift" are used interchangeably throughout the document. Further, the terms "body bias generator" and "back bias generator" are used interchangeably throughout the document. Furthermore, the terms "integrated circuit" and "semiconductor circuit" are used interchangeably throughout the document.

Figure 1:
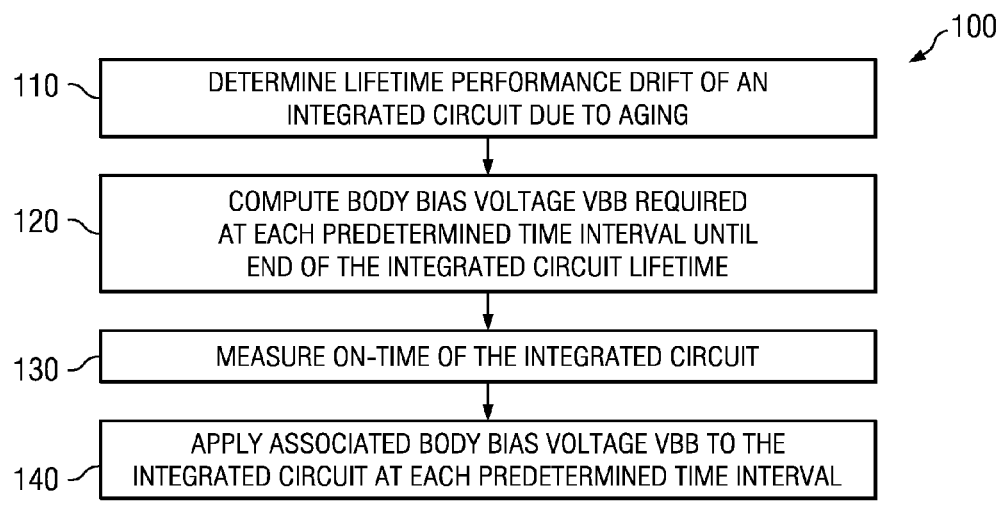
FIG. 1 is a flowchart illustrating a method for applying body bias to compensate for hot carrier and NBTI instability induced aging on integrated circuits according to an embodiment of the present subject matter.

FIG. 1 illustrates an example method 100 for compensating for product performance drift due to aging of an integrated circuit over life time by applying a body bias voltage VBB to the integrated circuit. At step 110, this example method 100 begins by determining a lifetime performance drift of the integrated circuit due to aging.

In some embodiments, the lifetime performance drift of the integrated circuit due to aging is computed using reliability simulations or by performing silicon level measurements at accelerated stress conditions. The determination of the lifetime performance drift is a pre-determined aging functionality—it is accomplished by performing aging assessment through a representative circuit. The lifetime performance drift can be used to calibrate the body bias generator circuit (this could be an on-chip circuit, a software module, or assessment of aging in the field) to output the body bias in order to compensate for the aging. In these embodiments, the integrated circuit is a CMOS circuit including a plurality of PMOS and NMOS transistors and the determination of the lifetime performance drift includes determining lifetime performance drift of the plurality of PMOS and NMOS transistors in the CMOS circuit. In some embodiments, the lifetime performance drift of the integrated circuit due to hot carrier and NBTI induced aging is determined using reliability simulations or by performing silicon level measurements at accelerated stress conditions At step 120, a body bias voltage VBB required at each predetermined time interval until end of the integrated circuit lifetime is computed using the determined lifetime performance drift of the integrated circuit. In some embodiments, the body bias voltage VBB required at each predetermined time interval until the end of the integrated circuit lifetime is computed for the plurality of PMOS and NMOS transistors based on determined lifetime performance drift of the plurality of PMOS and NMOS transistors.

At step 130, on-time of the integrated circuit is measured. At step 140, an associated computed body bias voltage VBB is applied to the integrated circuit at each predetermined time interval based on the measured on-time to compensate for the effect of aging. In some embodiments, the associated computed body bias voltage VBB is applied to body terminal of each of the plurality of PMOS and NMOS transistors in the CMOS circuit at each predetermined time interval until the end of the integrated circuit lifetime. In some embodiments, the associated computed body bias voltage VBB is applied to body terminal of each of the plurality of PMOS and NMOS transistors in the CMOS circuit during switching at each predetermined time interval. In some embodiments, the body bias voltage VBB is applied to body terminal of each of the plurality of PMOS and NMOS transistors to compensate for lifetime performance drifts due to manufacturing process variations.

Figure 4:
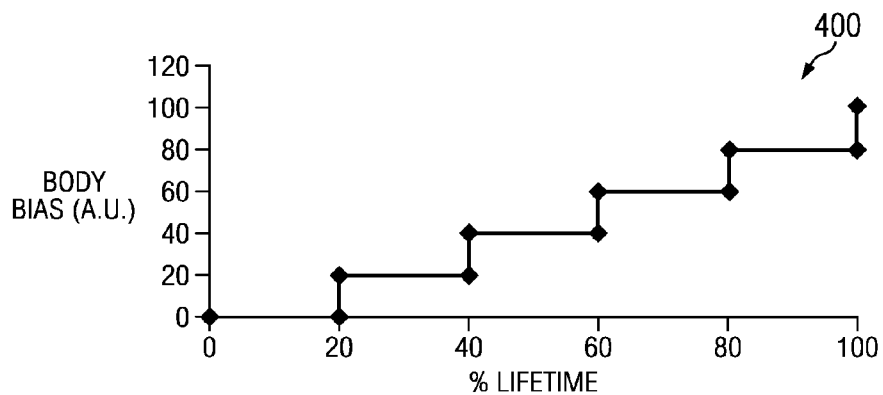
FIG. 4 is a graph showing application of body bias voltage to an integrated circuit according to an embodiment of the present subject matter shown in FIG. 1.
Figure 5:
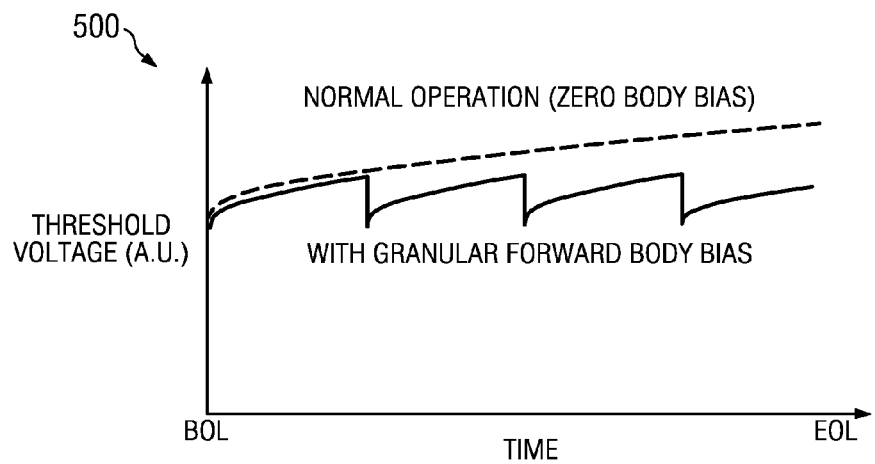
FIG. 5 is a graph showing an example resulting impact on threshold voltage when applying the body bias, such as those shown in FIG. 1.

Referring now to FIG. 4, there is shown a graph 400 illustrating an example application of a computed body bias voltage VBB to an integrated circuit according at each predetermined interval, i.e., at intervals of 20% of lifetime until the end of the integrated circuit lifetime. It can be seen in FIG. 4 that the application of the body bias voltage VBB is a step-wise function and thereby achieving a gradual compensation for the lifetime performance drift induced due to aging. The graph 500 in FIG. 5 illustrates an example resulting impact on threshold voltage when applying the step-wise body bias voltage VBB as shown in FIG. 4. It can be seen in FIG. 5 that the above compensation scheme can achieve a near normal threshold voltage until the end of life of the integrated circuit.

Figure 2:
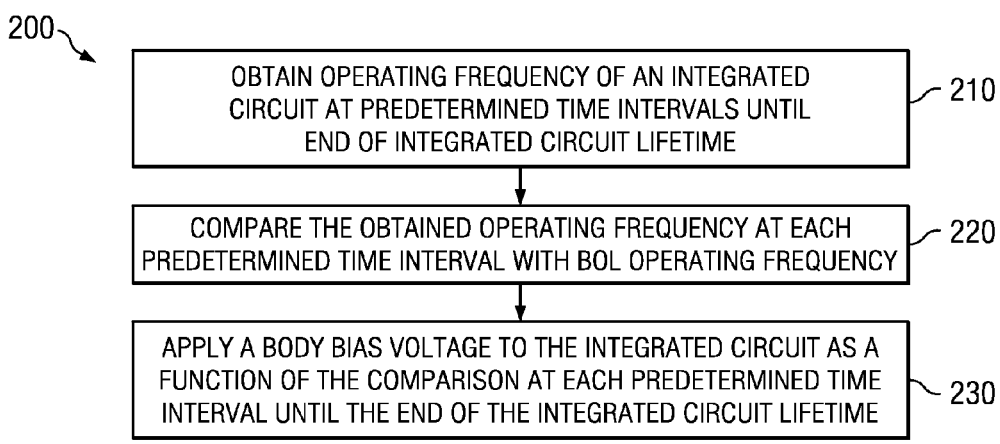
FIG. 2 is another flowchart illustrating a method for applying body bias to compensate for hot carrier and NBTI instability induced aging on integrated circuits according to an embodiment of the present subject matter.

FIG. 2 illustrates an example method 200 for compensating for product performance drift due to aging of an integrated circuit over life time by applying a body bias voltage VBB to the integrated circuit. At step 210, this example method 200 begins by obtaining an operating frequency of the integrated circuit using an oscillator at each one of predetermined time intervals until end of the integrated circuit lifetime. In these embodiments, the integrated circuit is a CMOS circuit including a plurality of PMOS and NMOS transistors. At step 220, the obtained operating frequency at each predetermined time interval is compared to beginning of life (BOL) operating frequency of the integrated circuit. At step 230, a body bias voltage VBB is then applied to the integrated circuit as a function of the comparison at each predetermined time interval so that the operating frequency of the integrated circuit remains substantially around the BOL operating frequency to compensate for the performance drift due to aging.

Figure 3:
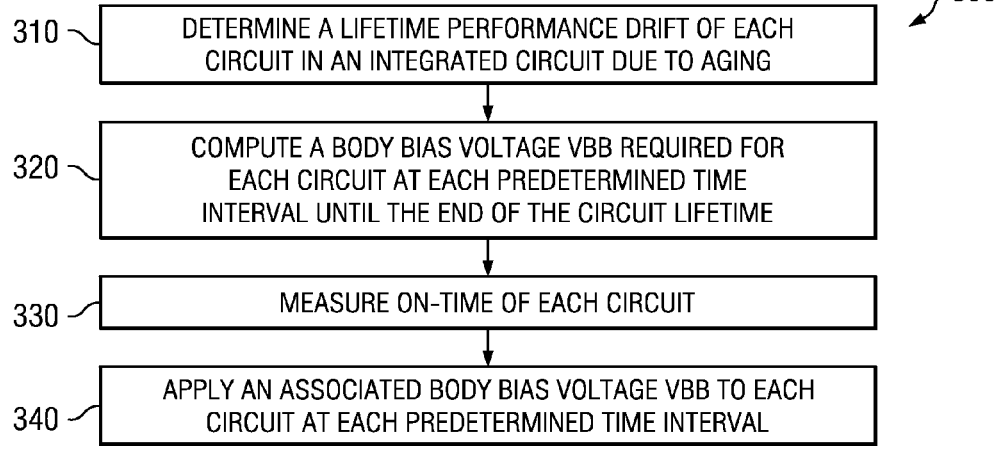
FIG. 3 is yet another flowchart illustrating a method for applying body bias to compensate for hot carrier and NBTI instability induced aging on integrated circuits according to an embodiment of the present subject matter.

FIG. 3 illustrates an example method 300 for compensating for product performance drift due to aging of one or more circuits disposed in an integrated circuit over life time by applying a body bias voltage VBB to the one or more circuits. At step 310, this example method 300 begins by determining a lifetime performance drift of each circuit due to aging. In some embodiments, the lifetime performance drift of each circuit due to hot carrier and NBTI induced aging is determined using reliability simulations or by performing silicon level measurements at accelerated stress conditions.

At step 320, a body bias voltage VBB required for each circuit is applied at each one of predetermined time intervals until the end of circuit lifetime based on the determined lifetime performance drift. At step 330, on-time of each circuit is measured. At step 340, an associated computed body bias voltage VBB is applied to each circuit at each predetermined time interval based on the associated measured on-time to compensate for the effect of aging.

Although the flowcharts 100, 200, and 300 which include steps 110-140, 210-230, and 310-340 that are arranged serially in the exemplary embodiments, other embodiments of the subject matter may execute two or more steps in parallel, using multiple processors or a single processor organized as two or more virtual machines or sub-processors. Moreover, still other embodiments may implement the steps as two or more specific interconnected hardware modules with related control and data signals communicated between and through the modules, or as portions of an application-specific integrated circuit. Thus, the exemplary process flow diagrams are applicable to software, firmware, and/or hardware implementations.

Figure 6:
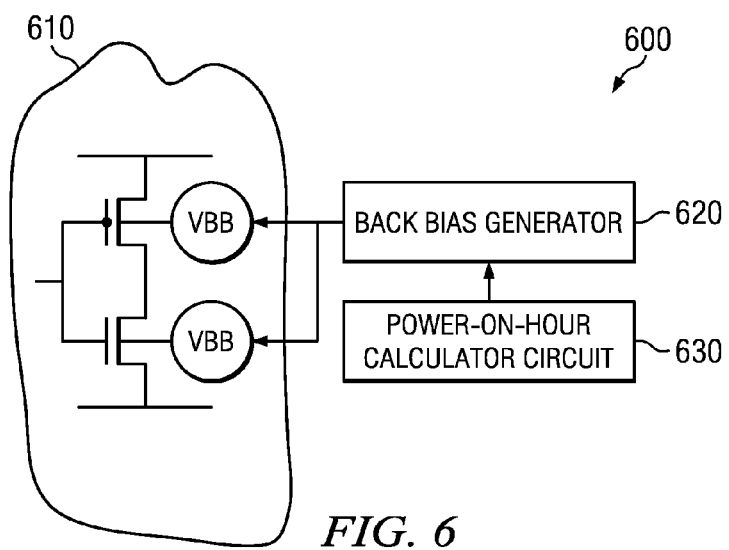
FIG. 6 is a schematic diagram illustrating integrated circuit including body bias and associated circuitry according to an embodiment of the present invention.

Referring now to FIG. 6, there is illustrated an example embodiment of an integrated circuit including a body bias compensation circuit used for compensating performance drift in a circuit due to aging. As shown in FIG. 6, the integrated circuit 600 includes a circuit 610 that has CMOS transistors whose lifetime performance can drift with age, a back bias generator 620, and a power-on-hour calculator circuit 630.

In operation, the power-on-hour calculator circuit 630 determines on-time of the circuit 610. The back bias generator 620 then computes a body bias voltage VBB required at each one of predetermined time intervals until end of the circuit lifetime based on a lifetime performance drift of the circuit obtained from a pre-assessment of the circuit. The pre-assessment can include using aging assessment techniques, such as a BERT based reliability simulations or silicon based measured at accelerated stress conditions. The back bias generator 620 then applies an associated computed body bias voltage VBB to the circuit at each predetermined time interval based on the measured on-time of the integrated circuit to compensate for the lifetime performance drift induced due to aging. The computation of the lifetime performance drift of the circuit using reliability simulations or by performing silicon level measurements at accelerated stress conditions and the operation of the body bias compensation circuit is explained in more detail with reference to FIG. 1.

Figure 7:
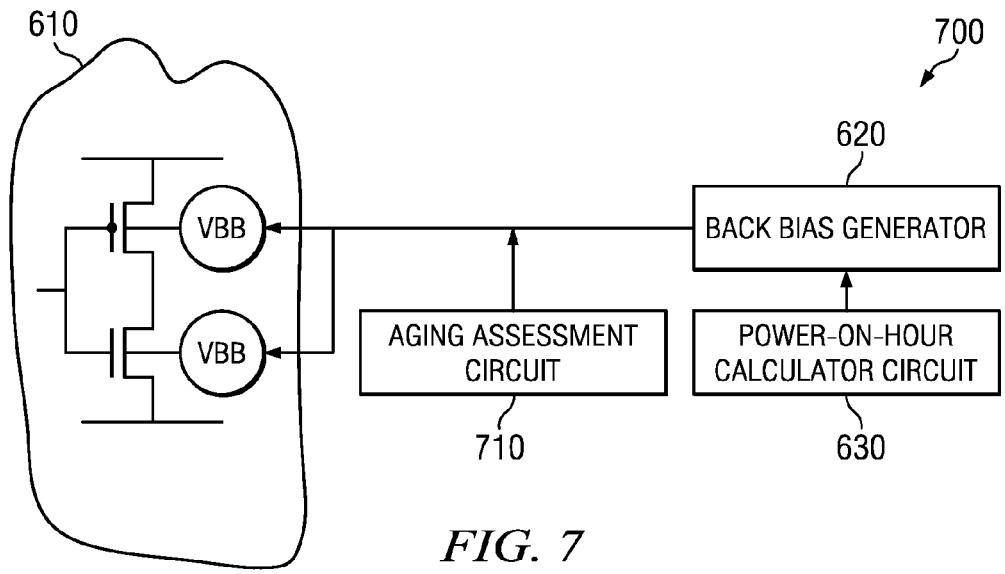
FIG. 7 is a schematic diagram illustrating integrated circuit including body bias, aging assessment and associated circuitry according to an embodiment of the present invention.

Referring now to FIG. 7, there is illustrated an example embodiment of an integrated circuit 700 including a body bias compensation circuit along with an aging assessment circuit for compensating performance drift in a circuit due to aging. As shown in FIG. 7, the integrated circuit 700 includes the circuit 610 that has CMOS transistors whose lifetime performance can drift with age, the back bias generator 620, the power-on-hour calculator circuit 630, and an aging assessment circuit 710. The operation of the integrated circuit 700 is similar to the operation of the integrated circuit 600 described above with reference to FIG. 6, except that the aging assessment circuit 710 determines the lifetime performance drift of the circuit 610. The back bias generator 620 then computes the body bias voltage VBB required at each of the predetermined time interval until the end of the circuit lifetime based on the determined lifetime performance drift of the circuit.

In some embodiments, the aging assessment circuit 710 determines lifetime performance drift of the circuit 610 due to hot carrier and NBTI induced aging on a real-time basis unlike the circuit shown in FIG. 6 where aging is pre-assessed one time. In these embodiments, the CMOS transistors include a plurality of PMOS and NMOS transistors. Also in these embodiments, the aging assessment circuit 710 dynamically determines the lifetime performance drift of a plurality of PMOS and NMOS transistors in the circuit 610. Further in these embodiments, the back bias generator 620 computes the body bias voltage VBB required at each predetermined time interval until the end of the circuit lifetime for the plurality of PMOS and NMOS transistors based on determined lifetime performance drift for the plurality of PMOS and NMOS transistors. The back bias generator 620 applies the associated computed body bias voltage VBB to a body terminal of each of the plurality of PMOS and NMOS transistors in the CMOS circuit 610 at each predetermined time interval until the end of the circuit lifetime. In some embodiments, the back bias generator 620 applies the associated computed body bias voltage VBB to the body terminal of each of the plurality of PMOS and NMOS transistors in the CMOS circuit during switching at each predetermined time interval. In some embodiments, the back bias generator 620 applies body bias voltage VBB to body terminal of each of the PMOS and NMOS transistors to compensate for threshold voltage shifts due to process variations.

In some embodiments, the integrated circuit includes one or more circuits. The aging assessment circuit 710 determines the lifetime performance drift of each circuit due to hot carrier and NBTI induced aging. The back bias generator 620 computes body bias voltage VBB required at predetermined time intervals until the end of the circuit lifetime based on the determined lifetime performance drift for each circuit. The power-on-hour calculator circuit 630 measures on-time of each circuit. The back bias generator 620 then applies an associated computed body bias voltage VBB to each circuit at each predetermined time interval based on the measured on-time to compensate for the lifetime performance drift due to hot carrier and NBTI induced aging.

Figure 8:
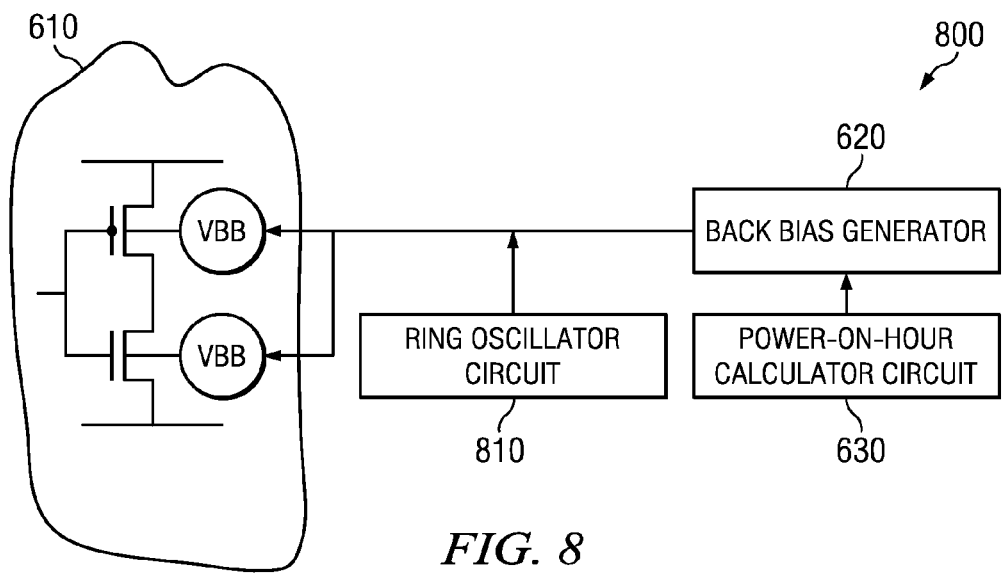
FIG. 8 is an example schematic diagram illustrating integrated circuit including body bias, ring oscillator and associated circuitry according to another embodiment of the present invention.

Referring now to FIG. 8, there is illustrated an example embodiment of a semiconductor circuit 800 including a body bias compensation circuit along with a ring oscillator circuit for compensating performance drift in a circuit due to aging. As shown in FIG. 7, the integrated circuit 700 includes the circuit 610 that has CMOS transistors whose lifetime performance can drift with age, the back bias generator 620, the power-on-hour calculator circuit 630, and ring oscillator circuit 810.

In operation, the ring oscillator circuit 810 obtains operating frequency of the semiconductor circuit at predetermined time intervals until end of life of the semiconductor circuit. The ring oscillator circuit 810 then compares the obtained operating frequency at each predetermined time interval to a beginning of life (BOL) operating frequency of the semiconductor circuit 610. The back bias generator 620 applies a body bias voltage VBB to the semiconductor circuit 610 as a function of the comparison so that the operating frequency of the semiconductor circuit remains substantially around the BOL operating frequency to compensate for the lifetime performance shift due to aging. In some embodiments, the semiconductor circuit is a CMOS circuit including a plurality of PMOS and NMOS transistors.

The above-described architecture provides a solution for integrated circuit aging by using the body bias. The above technique achieves improved performance in an integrated circuit by decoupling the leakage penalty due to increased operating voltage VDD by using progressive and granular compensation technique as show in FIGS. 4-5. Further, the technique offers increased yield for design flows which do not model aging and do speed binning. Furthermore, the above technique provides a tightly bound performance over the lifetime of the integrated circuit without compromising on the leakage.

Although the above technique is described with reference to compensating for performance drift due to CHC and NBTI induced aging, it can be envisioned that the above technique can be also used for compensating for performance drifts due to other degradation phenomena/aging mechanisms, such as degradation of transistors due to gate-oxide-integrity/time-dependent die-electric break down (GOI/TDDB) and the like.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1-8 are merely representational and are not drawn to scale. Certain proportions thereof may be exaggerated, while others may be minimized. FIGS. 1-8 illustrate various embodiments of the invention that can be understood and appropriately carried out by those of ordinary skill in the art.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A processor-implemented method of compensating for product performance drift due to aging of an integrated circuit, comprising:
    determining a lifetime performance drift of the integrated circuit due to aging;
    computing a body bias voltage VBB required at each predetermined time interval until end of the integrated circuit lifetime based on the determined lifetime performance drift of the integrated circuit;
    measuring on-time of the integrated circuit; and
    applying an associated computed body bias voltage VBB to the integrated circuit at each predetermined time interval based on the measured on-time, which compensates for the effect of aging.

2. The method of claim 1, wherein determining the life performance drift of the integrated circuit due to aging, comprises: determining the lifetime performance drift of the integrated circuit due to aging using reliability simulations or by performing silicon level measurements at accelerated stress conditions.

3. The method of claim 1, wherein the integrated circuit comprises a CMOS circuit, wherein the CMOS circuit includes a plurality of PMOS and NMOS transistors.

4. The method of claim 1 wherein determining the lifetime performance drift of the integrated circuit comprises: determining the lifetime performance drift of a the plurality of PMOS and NMOS transistors in the CMOS circuit.

5. The method of claim 4, wherein computing the body bias voltage VBB comprises: computing the body bias voltage VBB required at each predetermined time interval until the end of the integrated circuit lifetime for the plurality of PMOS and NMOS transistors based on determined lifetime performance drift of the plurality of PMOS and NMOS transistors.

6. The method of claim 5, wherein applying the associated computed body bias voltage VBB to the integrated circuit at each predetermined time interval comprises: applying the associated computed body bias voltage VBB to body terminal of each of the plurality of PMOS and NMOS transistors in the CMOS circuit at each predetermined time interval until the end of the integrated circuit lifetime.

7. The method of claim 6, wherein applying the associated computed body bias voltage VBB to the plurality of PMOS and NMOS transistors in the CMOS circuit at each predetermined time interval comprises: applying the associated computed body bias voltage VBB to body terminal of each of the plurality of PMOS and NMOS transistors in the CMOS circuit during switching at each predetermined time interval.

8. The method of claim 6 further comprising: applying body bias voltage VBB to body terminal of each of the plurality of PMOS and NMOS transistors to compensate for lifetime performance drifts due to manufacturing process variations.

9. A software, firmware, or hardware implementable method for compensating for performance drift due to aging of an integrated circuit, comprising:
    obtaining operating frequency of the integrated circuit using an oscillator at each one of predetermined time intervals until end of an integrated circuit lifetime associated with the integrated circuit;

comparing the obtained operating frequency at each predetermined time interval to beginning of life (BOL) operating frequency of the integrated circuit; and applying a body bias voltage VBB to the integrated circuit as a function of the comparison at each predetermined time interval to maintain the operating frequency of the integrated circuit substantially around the BOL operating frequency, which compensates for the performance drift due to aging.

10. The method of claim 9, wherein, in compensating, the integrated circuit comprises a CMOS circuit and wherein the CMOS circuit includes a plurality of PMOS and NMOS transistors.

11. A machine implemented method for compensating lifetime performance drift due to aging of one or more circuits disposed in an integrated circuit comprising:

determining a lifetime performance drift of each circuit due to aging;

computing a body bias voltage VBB required for each circuit at each one of predetermined time intervals until the end of circuit lifetime based on the determined lifetime performance drift;

measuring on-time of each circuit; and applying an associated computed body bias voltage VBB to each circuit at each predetermined time interval based on the associated measured on-time, which compensates for the effect of aging.

12. The method of claim 11, wherein determining the lifetime performance drift of each circuit comprises: determining the lifetime performance drift of each circuit due to hot carrier and negative bias temperature instability (NBTI), induced aging using reliability simulations or by performing silicon level measurements at accelerated stress conditions.

13. The method of claim 12, further comprising: determining the circuit lifetime of each circuit.

14. An integrated circuit comprising:

a circuit that has CMOS transistors whose lifetime performance can drift with age;

a calculator circuit that determines on-time of the circuit; and a body bias generator that computes a body bias voltage VBB required at each one of predetermined time intervals until end of the circuit lifetime based on a lifetime performance drift of the circuit and wherein the body bias generator applies an associated computed body bias voltage VBB to the circuit at each predetermined time interval based on the measured on-time of the integrated circuit to compensate for the lifetime performance drift induced due to aging.

15. The integrated circuit of claim 14, further comprising: an aging assessment circuit that determines the lifetime performance drift of the circuit, wherein the body bias generator computes the body bias voltage VBB required at each of the predetermined time interval until the end of the circuit lifetime based on the determined lifetime performance drift of the circuit.

16. The integrated circuit of claim 15, wherein the aging assessment circuit determines lifetime performance drift of the circuit due to hot carrier and negative bias temperature instability (NBTI) induced aging.

17. The integrated circuit of claim 15, wherein the CMOS transistors comprise a plurality of PMOS and NMOS transistors.

18. The integrated circuit of claim 17, wherein the aging assessment circuit determines the lifetime performance drift of a plurality of PMOS and NMOS transistors in the circuit.

19. The integrated circuit of claim 18, wherein the body bias generator computes the body bias voltage VBB required at each predetermined time interval until the end of the circuit lifetime for the plurality of PMOS and NMOS transistors based on determined lifetime performance drift for the plurality of PMOS and NMOS transistors and wherein the body bias generator applies the associated computed body bias voltage VBB to a body terminal of each of the plurality of PMOS and NMOS transistors in the CMOS circuit at each predetermined time interval until the end of the circuit lifetime.

20. The integrated circuit of claim 19, wherein the body bias generator applies the associated computed body bias voltage VBB to the body terminal of each of the plurality of PMOS and NMOS transistors in the CMOS circuit during switching at each predetermined time interval.

21. The integrated circuit of claim 20, wherein the body bias generator applies body bias voltage VBB to body terminal of each of the PMOS and NMOS transistors to compensate for threshold voltage shifts due to process variations.

22. A semiconductor circuit comprising:

a ring oscillator circuit that obtains operating frequency of the semiconductor circuit at predetermined time intervals until end of life of the semiconductor circuit, wherein the ring oscillator circuit compares the obtained operating frequency at each predetermined time interval to a beginning of life (BOL) operating frequency of the semiconductor circuit; and a body bias generator that applies a body bias voltage VBB to the semiconductor circuit as a function of the comparison so that the operating frequency of the semiconductor circuit remains substantially around the BOL operating frequency to compensate for the lifetime performance shift due to aging.

23. The semiconductor circuit of claim 22, wherein the semiconductor circuit comprises a CMOS circuit and wherein the CMOS circuit includes a plurality of PMOS and NMOS transistors.

24. An integrated circuit comprising:

one or more circuits;

an aging assessment circuit that determines a lifetime performance drift of each circuit due to hot carrier and negative bias temperature instability (NBTI) induced aging;

a body bias generator that computes body bias voltage VBB required at predetermined time intervals until the end of a circuit lifetime based on the determined lifetime performance drift for each circuit; and a calculator circuit that measures on-time of each circuit, and wherein the body bias generator applies an associated computed body bias voltage VBB to each circuit at each predetermined time interval based on the measured on-time to compensate for the lifetime performance drift due to hot carrier and NBTI induced aging.

* * * * *